United States Patent [19]

Makino et al.

[11] Patent Number: 5,955,891
[45] Date of Patent: *Sep. 21, 1999

[54] SEMICONDUCTOR INTEGRATED CIRCUIT DEVICE WITH OUTPUT CIRCUIT

[75] Inventors: Eiichi Makino; Masaru Koyanagi, both of Yokohama, Japan

[73] Assignee: Kabushiki Kaisha Toshiba, Tokyo, Japan

[ * ] Notice: This patent is subject to a terminal disclaimer.

[21] Appl. No.: 08/572,381

[22] Filed: Dec. 14, 1995

Related U.S. Application Data

[63] Continuation of application No. 08/242,714, May 13, 1994, Pat. No. 5,491,430.

[30] Foreign Application Priority Data

May 15, 1993 [JP] Japan ................................... 5-136867
Apr. 22, 1994 [JP] Japan ................................... 6-085074

[51] Int. Cl.[6] .............................................. H03K 19/0185
[52] U.S. Cl. ............................... 326/33; 326/27; 326/34; 326/83
[58] Field of Search ................................ 326/33–34, 81, 326/26–27, 121, 22–23, 83, 86; 327/327–328, 541

[56] References Cited

U.S. PATENT DOCUMENTS

| | | |
|---|---|---|
| 4,585,955 | 4/1986 | Uchida . |
| 4,855,623 | 8/1989 | Flaherty . |
| 4,877,978 | 10/1989 | Platt . |
| 4,894,561 | 1/1990 | Nogami ................................... 326/33 |
| 4,906,866 | 3/1990 | Alexander et al. . |
| 4,942,398 | 7/1990 | Peterson ................................... 326/83 |
| 4,975,599 | 12/1990 | Petrovick, Jr. et al. . |
| 4,978,905 | 12/1990 | Hoff et al. . |
| 5,015,625 | 5/1991 | Ikeda et al. . |
| 5,017,807 | 5/1991 | Kriz et al. . |
| 5,021,684 | 6/1991 | Ahuja et al. .............................. 326/83 |
| 5,043,604 | 8/1991 | Komaki . |
| 5,214,320 | 5/1993 | Truong ..................................... 326/33 |
| 5,329,185 | 7/1994 | Cooperman et al. . |
| 5,491,430 | 2/1996 | Makino et al. ........................... 326/33 |
| 5,570,038 | 10/1996 | Makino et al. ........................... 326/33 |

FOREIGN PATENT DOCUMENTS 0315473  11/1988  European Pat. Off. .
4113717  4/1992  Japan .

*Primary Examiner*—Jon Santamauro

[57] ABSTRACT

The control voltage $\phi 1$ outputted by the control voltage generating circuit 1 is at a low level in a range where an external supply voltage Vcc is lower than the threshold value of the transistor P1, but increases continuously in analog manner when the external supply voltage Vcc rises. After having matched the external supply voltage Vcc, the control voltage $\phi 1$ increases in the same way as the external supply voltage Vcc. By use of the control voltage provided with the characteristics as described above for an output circuit, controlled is the gate of a transistor P4 of a low-voltage operating output section 6 operative only at a voltage lower than a predetermined value. The transistor P2 of a full-voltage operating output section 5 of the output circuit is always operative on the basis of the control signal $\phi H$ of the data output control circuit 3. When the external supply voltage is low below the predetermined value, the transistor P4 is perfectly turned on, so that the conductance thereof increases. In the semiconductor integrated circuit device operative on the basis of a plurality of supply voltages, it is possible to prevent the operation margin from being reduced near the switching point of the gate voltages of the driving transistors and the data output transistors.

3 Claims, 12 Drawing Sheets

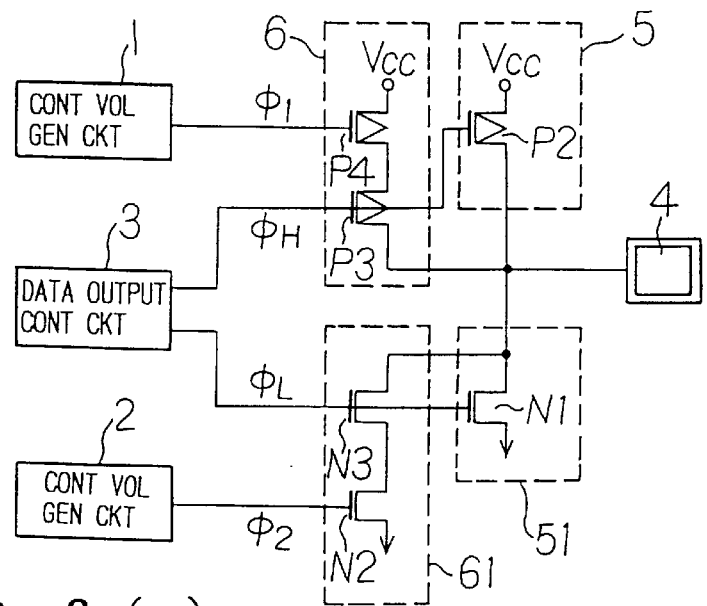
F I G. 3 (a)
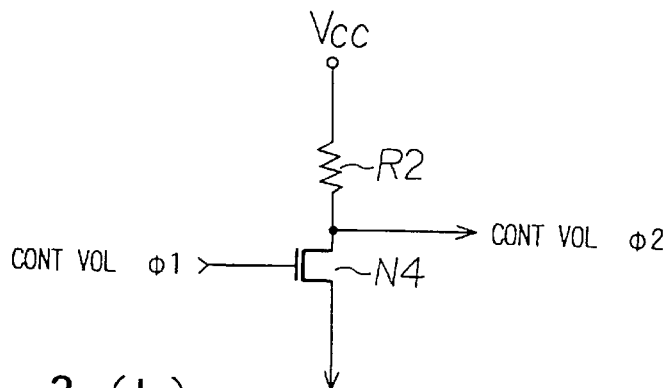
F I G. 3 (b)
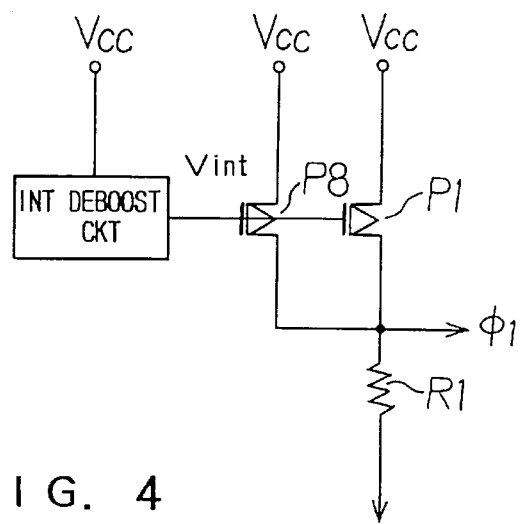
F I G. 4

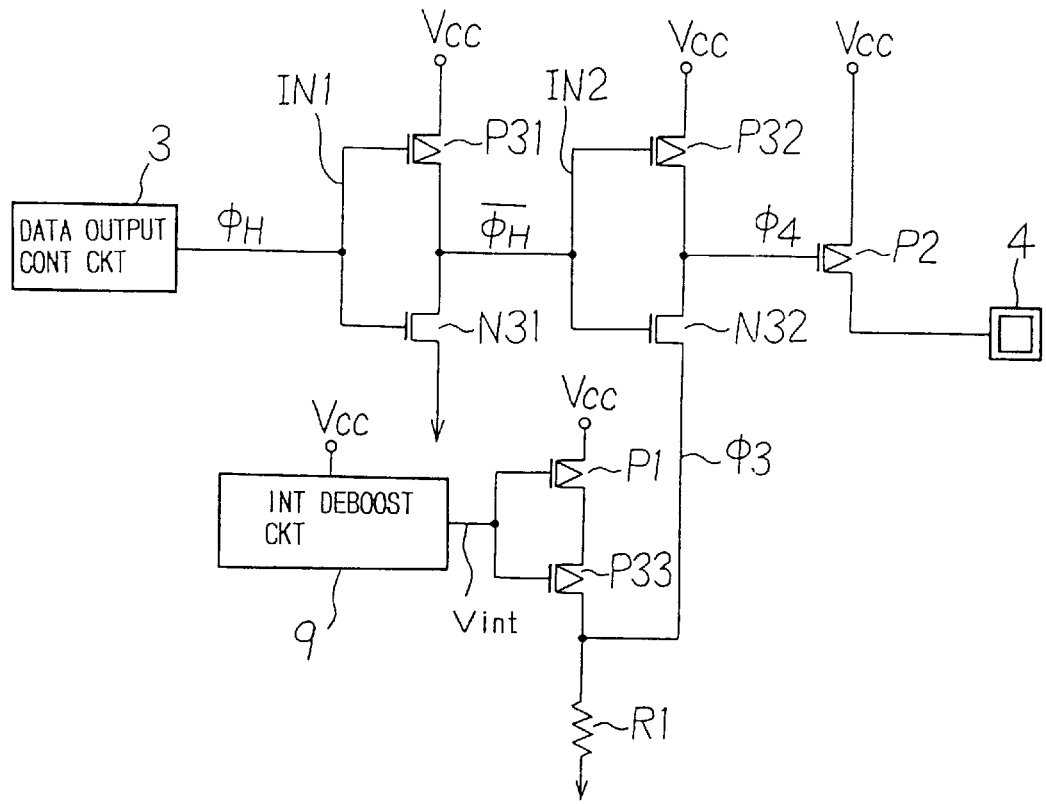
F I G. 9
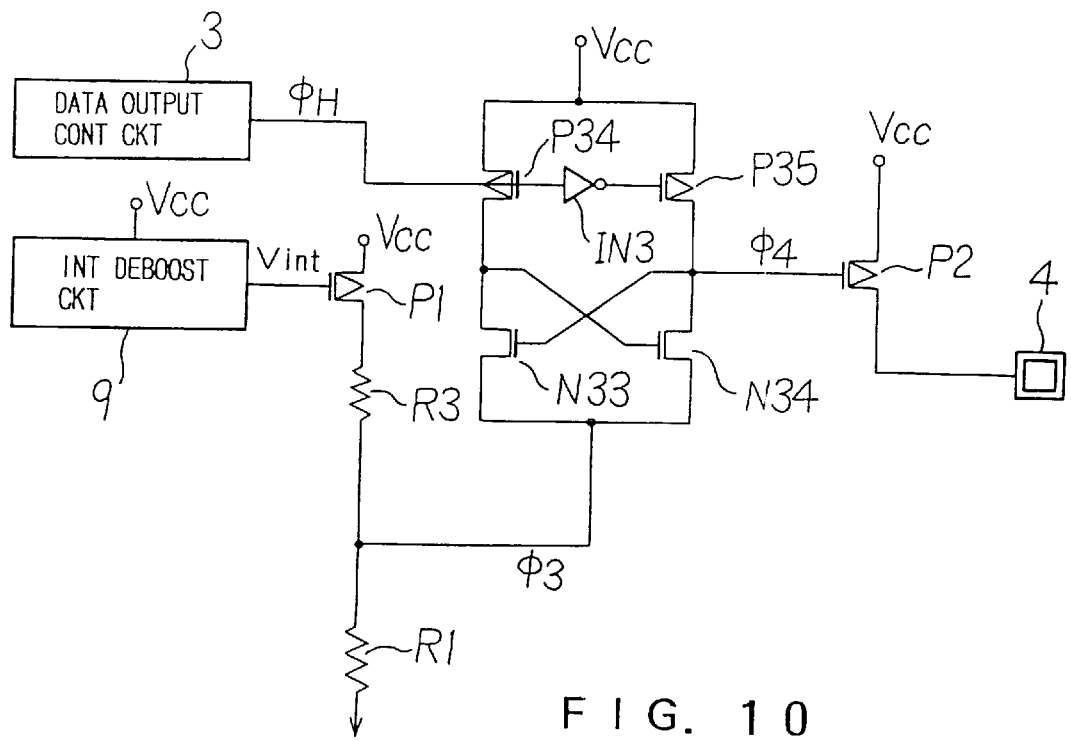
F I G. 10

SEMICONDUCTOR INTEGRATED CIRCUIT DEVICE WITH OUTPUT CIRCUIT

This is a continuation of U.S. patent application Ser. No. 08/242,714, filed May 13, 1994, now U.S. Pat. No. 5,491,430.

BACKGROUND OF THE INVENTION

The present invention relates to a semiconductor integrated circuit device provided with a data output mechanism, and more specifically to a semiconductor integrated circuit device which uses a plurality of supply voltages so as to correspond to a microminiaturized structure.

In the semiconductor integrated circuit device, the elements thereof have now being microminiaturized rapidly with an increase in need for higher integration rate. Therefore, when an external supply voltage Vcc is applied as it is to the integrated circuits formed on a semiconductor substrate, there arise various problems in that a gate oxide film of the elements is broken down, hot carriers are produced, etc., so that the integrated circuits are deteriorated in reliability and durability. To overcome these problems, it has been required to provide an internal supply voltage deboosting circuit for reducing an external supply voltage within the semiconductor integrated circuit device itself. For instance, an external supply voltage of 5 V is deboosted down to about 3 V through the internal supply voltage deboosting circuit. When this deboosted supply voltage is used, it is also possible to reduce the power consumption of the semiconductor device.

For the reason as described above, although the internal supply voltage deboosting circuit has been adopted for the semiconductor device, so far it has been difficult to secure a margin in both the low voltage operation and the high voltage operation in the same integrated circuits. Therefore, when the supply voltage is low, since the transistor driving capability decreases, the conductances of the data outputting transistor and the internal voltage supply driving transistor have been both increased to supplement the decrease in the transistor driving capability and further to compensate for a delay in data output and a drop in the internally deboosted supply voltage. In contrast with this, when the supply voltage is high, since the transistor driving capability increases, the output noise increases. To overcome the above-mentioned problems, there has been proposed such an integrated circuit device that a switching circuit is additionally provided to increase the conductances of the data output transistor and the internal voltage supply driving transistor only in the low supply voltage operation, as compared with the high supply voltage operation.

FIG. 19 shows a circuit related to the invention which is provided with an internal voltage supply driving transistor for increasing the current supplying capability of the internal deboosting circuit when the external supply voltage is low. This circuit is composed of a P-channel transistor P12 having a source connected to an external supply voltage (Vcc) terminal and a gate connected to a control voltage generating circuit 1, a P-channel transistor P11 having a source connected to a drain of the P-channel transistor P12 and a gate connected to an internal deboosting control circuit 7, and a P-channel transistor P10 having a source connected to the external supply voltage (Vcc) terminal and a gate connected to the internal deboosting control circuit 7. In this circuit, an internal supply voltage Vint is outputted from the drains of the two P-channel transistors P10 and P11. In the drawing, the P-channel transistor P10 operates on the basis of a control signal φD applied by the internal deboosting control circuit 7, without depending upon the external supply voltage. The P-channel transistor P12 is controlled on the basis of a control voltage φA applied by the control voltage generating circuit 1 to the gate thereof, in such a way as to be operative only when the external supply voltage is lower than a predetermined voltage. Accordingly, the output circuit having the internal supply voltage driving transistor is composed of a full-voltage operating output section 5 provided with the transistor P10 and operative without depending upon the external supply voltage and a low-voltage operating output section 6 provided with the two transistors P11 and P12 and operative only when the external supply voltage is lower than a predetermined voltage.

FIG. 20 shows the dependency of the control voltage φA upon the external supply voltage Vcc. FIG. 20 indicates that the control voltage φA is kept roughly at zero volts in the low-voltage operation range. However, when the external supply voltage Vcc reaches a predetermined value, the control voltage φA rises abruptly digitally. When the gate voltage of the driving P-channel transistor P12 is changed digitally as described above, since the internally deboosted potential also changes abruptly at the on-off switching point of the driving transistor, there exists a problem in that an erroneous operation occurs easily due to generation of supply voltage noise. Further, when the circuit is operated in the vicinity of the switched voltage, since the internal supply voltage Vint enters a discontinuous range, there exists a problem in that the circuit operation becomes unstable.

Further, in order to increase the conductance of the output transistor so that the data output speed increases when the external supply voltage is low, if the gate voltage of the output transistor is controlled so as to rise up to a predetermined value digitally as shown in FIG. 20, since the conductance of the output transistor changes abruptly in the vicinity of the voltage at which the output transistor is switched from on to off, the output noise cannot be reduced, with the result that an erroneous operation occurs. Further, since a discontinuous point is produced in the output transistor in the vicinity of the switched voltage, there exists a problem in that this exerts a harmful influence upon the dynamic characteristics of the circuit.

In addition, when the gate voltage of the driving transistor P12 is changed digitally, since the inspection process is complicated, the manufacturing cost thereof increases.

In more detail, FIG. 21 shows the change of the access time according to the external supply voltage Vcc. In the case of the device having no circuit for switching the conductance value of the data output transistor or the internal supply voltage driving transistor according to the external supply voltage Vcc, as shown by the dashed line L1, the access time increases with decreasing external supply voltage Vcc.

In the circuit related to the invention as shown in FIG. 19, since the P-channel transistor P12 is turned on in the vicinity of the external supply voltage Vcc of about 3.5 V for instance, the access time can be reduced sharply as shown in the dot-dashed line L2.

As far as the access time changes continuously as shown in the dashed line L1, there exists no problem as far as the circuit device is inspected by measuring the access times at only two points A and B. In the case of the circuit device in which the access time changes abruptly as shown by the dot-dashed line L2, however, it is necessary to measure the access time at a plurality of points C1, C2, C3, . . . (the access time changes abruptly at these points). This is because an erroneous operation may occur at or near the switched voltage due to the switching operation noise or due to the internal timing mismatch. Therefore, the inspection process is complicated and thereby a long inspection time is required.

SUMMARY OF THE INVENTION

With these problems in mind, therefore, it is the object of the present invention to provide a semiconductor integrated circuit device which can prevent a decrease in the operation margin even when the external supply voltage differs, and further can shorten the inspection time for reduction of the inspection cost thereof.

To achieve the above-mentioned object, the present invention provides a semiconductor integrated circuit device, comprising: a reference voltage generating circuit supplied with an external supply voltage, for generating a reference voltage; a control voltage generating circuit for outputting a control voltage changing substantially in analog manner according to difference between the reference voltage generated by said reference voltage generating circuit and an external supply voltage; a data output control circuit for outputting a data signal used for outputting data; and an output circuit for receiving the control voltage outputted by said control voltage generating circuit and the data signal outputted by said data output control circuit, and for outputting data according to the data signal in such a way that driving capability of thereof is controlled in analog manner on the basis of the control voltage according to the external supply voltage.

The output circuit comprises a low-voltage operating output section and a full-voltage operating output section connected in parallel to each other between an external supply voltage terminal and an output terminal; the low-voltage operating output section receives the control voltage and the data signal, and outputs data according to the received data signal in such a way that the driving capability is high when the external supply voltage is lower than a predetermined value but reduced gradually when the external supply voltage is higher than the predetermined value; and the full-voltage operating output section receives the data signal, and outputs data according to the received data signal.

Further, the control voltage generating circuit comprises: a P-channel transistor having a source for receiving the external supply voltage and a gate for receiving the reference voltage generated by said reference voltage generating circuit; and a resistance connected between a drain of said P-channel transistor and a ground voltage terminal, the control voltage being outputted from a junction node between the drain of said P-channel transistor and said resistance.

Further, the control voltage generating circuit comprises: a plurality of parallel-connected P-channel transistors of different threshold voltages, each having a source for receiving the external supply voltage and a gate for receiving the reference voltage generated by said reference voltage generating circuit; and a resistance connected between drains of said P-channel transistors and a ground voltage terminal, the control voltage being outputted from a junction node between the drains of said P-channel transistors and said resistance.

Here, instead of the reference voltage generating circuit, it is also possible to use an internal supply voltage deboosting circuit for deboosting the supplied external supply voltage to generate an internal supply voltage of a predetermined level.

Further, the present invention provides a semiconductor integrated circuit device, comprising: an internal supply voltage deboosting circuit supplied with an external supply voltage, for generating an internal supply voltage deboosted down to a predetermined level; a control voltage generating circuit for outputting a control voltage changing substantially in analog manner according to difference between the internal supply voltage generated by said internal supply voltage deboosting circuit and an external supply voltage; a data output control circuit for outputting a data signal used for outputting data; and an output circuit for receiving the control voltage outputted by said control voltage generating circuit and the data signal outputted by said data output control circuit, and for outputting data according to the data signal in such a way that driving capability of thereof is controlled in analog manner on the basis of the control voltage according to the external supply voltage.

Further, the present invention provides a semiconductor integrated circuit device, comprising: a reference voltage generating circuit supplied with an external supply voltage, for generating a reference voltage; a first control voltage generating circuit for outputting a first control voltage changing substantially in analog manner according to difference between the reference voltage generated by said reference voltage generating circuit and an external supply voltage; a data output control circuit for outputting a first data signal used for a first-level data output and a second data signal used for a second-level data output; a first output circuit for receiving the first control voltage outputted by said first control voltage generating circuit and the first data signal outputted by said data output control circuit, and for outputting data according to the first data signal in such a way that driving capability of thereof is controlled on the basis of the first control voltage; a second control voltage generating circuit for outputting a second control voltage changing substantially in analog manner according to difference between the first control voltage outputted by said first control voltage generating circuit and the external supply voltage; and a second output circuit for receiving the second control voltage outputted by said second control voltage generating circuit and the second data signal outputted by said data output control circuit, and for outputting data according to the second data signal in such a way that driving capability of thereof is controlled on the basis of the second control voltage.

Furthermore, the present invention provides a semiconductor integrated circuit device, comprising: an internal supply voltage deboosting circuit supplied with an external supply voltage, for generating an internal supply voltage deboosted down to a predetermined level; a first control voltage generating circuit for outputting a first control voltage changing substantially in analog manner according to difference between the internal supply voltage generated by said internal supply voltage deboosting circuit and an external supply voltage; a data output control circuit for outputting a first data signal used for a first-level data output and a second data signal used for a second-level data output; a first output circuit for receiving the first control voltage outputted by said first control voltage generating circuit and the first data signal outputted by said data output control circuit, and for outputting data according to the first data signal in such a way that driving capability of thereof is controlled on the basis of the first control voltage; a second control voltage generating circuit for outputting a second control voltage changing substantially in analog manner according to difference between the first control voltage outputted by said first control voltage generating circuit and the external supply voltage; and a second output circuit for receiving the second control voltage outputted by said second control voltage generating circuit and the second data signal outputted by said data output control circuit, and for outputting data according to the second data signal in such a way that driving capability of thereof is controlled on the basis of the second control voltage.

In the above-mentioned semiconductor integrated circuit device according to the present invention, it is possible to use the internal supply voltage deboosting circuit, instead of the reference voltage generating circuit.

In the semiconductor integrated circuit device according to the present invention, since the conductance of the data output transistor or the internal supply voltage driving transistor can be changed gradually and continuously in analog manner, it is possible to effectively suppress a drop of the operation margin in the vicinity of the switching point of the external supply voltage between the high voltage and the low voltage. Further, the generation of the output noise can be also suppressed. Furthermore, since the access time changes continuously according to the external supply voltage, it is possible to reduce the inspection points in comparison with when the conductance of the transistors changes abruptly, thus reducing the inspection time.

BRIEF DESCRIPTION OF THE DRAWINGS

FIG. 3(a) is a circuit diagram showing the output circuit of a second embodiment of the semiconductor integrated circuit device according to the present invention;

FIG. 3(b) is a circuit diagram showing a control voltage generating circuit incorporated in the same semiconductor integrated circuit device shown in FIG. 3(a);

FIG. 4 is a circuit diagram showing a control voltage generating circuit of a third embodiment of the semiconductor integrated circuit device according to the present invention;

FIG. 9 is a circuit diagram showing a seventh embodiment of the semiconductor integrated circuit device according to the present invention;

FIG. 10 is a circuit diagram showing an eighth embodiment of the semiconductor integrated circuit device according to the present invention;

DETAILED DESCRIPTION OF THE PREFERRED EMBODIMENTS

The embodiments of the present invention will be described hereinbelow with reference to the attached drawings.

Figure 1A:
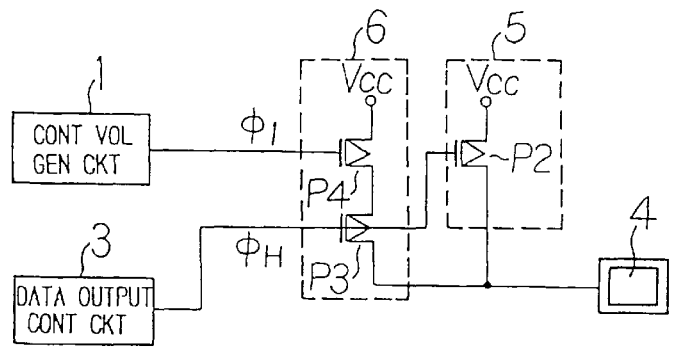
FIG. 1(a) is a circuit diagram showing a first embodiment of the semiconductor integrated circuit device according to the present invention.
Figure 1B:
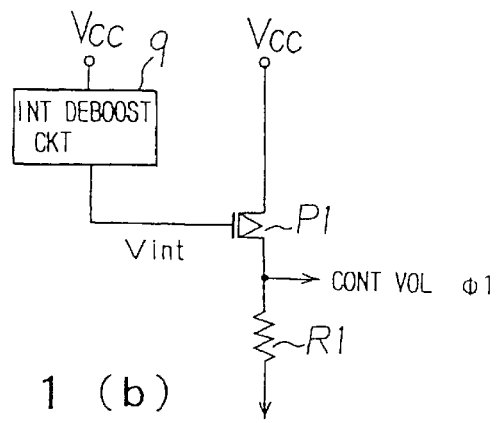
FIG. 1(b) is a circuit diagram showing a control voltage generating circuit incorporated in the same semiconductor integrated circuit device shown in FIG. 1(a)
Figure 2:
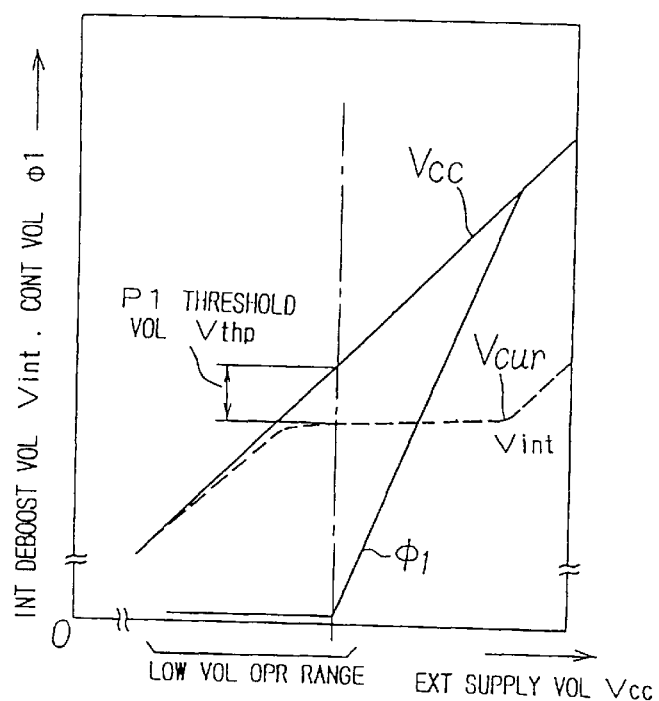
FIG. 2 is a characteristic diagram showing the dependencies of the generated control voltage φ1 upon the external supply voltage in the semiconductor integrated circuit device.

The first embodiment thereof is explained with reference to FIGS. 1(a), 1(b), 2, 17 and 18. FIG. 1(a) shows an output circuit of the semiconductor integrated circuit device and FIG. 1(b) shows a control voltage generating circuit used to control the gate voltage of a P-channel output transistor of the output circuit. Further, FIG. 2 is a characteristic diagram showing the dependencies of the control voltage φ1 1and the conductance of the transistor P1 upon the external supply voltage, in which the external supply voltage Vcc is represented along the abscissa and the internal supply voltage Vint, the control voltage φ1, and the conductancof the P-channel transistor P1 are all represented along the ordinate. As shown in FIG. 1(b), the control voltage generating circuit 1 is composed of a P-channel transistor P1 having a source connected to an external supply voltage Vcc and a gate connected to an internal supply voltage Vint, and a resistor R1 connected between the drain of the transistor P1 and the ground potential. Here, the internal supply voltage Vint can be generated by deboosting the supply voltage Vcc by an internal supply voltage deboosting circuit 9. A control voltage φ1 is taken out of an intermediate tap between the transistor P1 and the resistor R1. Here, in a range where the gate-source voltage Vgs (Vcc–Vint) of the transistor P1 is lower than the threshold voltage Vthp of the transistor P1, since the transistor P1 is kept turned off, the control voltage φ1 is at a low level. However, when the voltage (Vcc–Vint) rises beyond the threshold voltage Vthp of the transistor P1, the transistor P1 begins to be turned on.

In the range where the transistor P1 has been just turn on, since the conductance of the P-channel transistor P1 is small, the control voltage φ1 is determined by a voltage division ratio of the transistor P1 and the resistor R1. In other words, the control voltage φ1 can be expressed by Vcc·R1/(R1+R), where R denotes the resistance of the transistor P1 and R1 denotes the resistance value of the resistor R1. Accordingly, since the conductance of the transistor P1 increases with increasing gate-source voltage of the transistor P1, the control voltage φ1 increases in analog manner with increasing external supply voltage Vcc. When the external supply voltage Vcc further increases, since the gate-source voltage (Vcc–Vint) rises sufficiently high, the resistance R of the transistor P1 is reduced and thereby can be disregarded in comparison with that of the resistor R1. That is, since the voltage drop of the transistor P1 is roughly negligible, the level of the control voltage φ1 becomes roughly equal to the external supply voltage Vcc.

Figure 22:
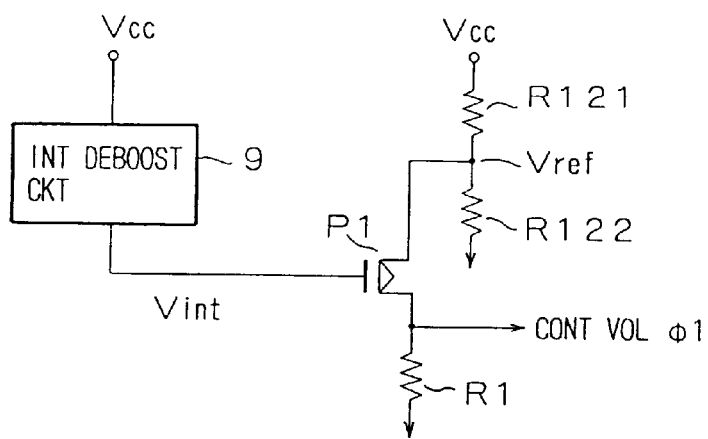
FIG. 22 is a circuit diagram showing a control voltage generating circuit incorporated in the same semiconductor integrated circuit device shown in FIG. 1(a).

The source of transistor P1 can be inputted the reference voltage $V_{ref}$ instead of the external supply voltage $v_{cc}$ as shown FIG. 22.

The control voltage generating circuit provided with the characteristics of the control voltage φ1 as described above is incorporated in the output circuit as shown in FIG. 1(a). This output circuit is composed of a P-channel transistor P4 having a source connected to the external supply voltage (Vcc) terminal and a gate connected to the control voltage generating circuit 1, a P-channel transistor P3 having a source connected to the drain of the P-channel transistor P4 and a gate connected to a data output control circuit 3, and a P-channel transistor P2 having a source connected to the external supply voltage (Vcc) terminal and a gate connected to the data output control circuit 3. Further, the drains of the P-channel transistors P2 and P3 are connected to an input/output terminal (I/O pad) 4, respectively. In this circuit, the transistor P2 constructs a full-voltage operating output section 5 operative without depending upon the external supply voltage, and the transistors P3 and P4 construct a low-voltage operating output section 6 operative only when the external supply voltage Vcc is lower than a predetermined voltage. The transistor P4 is operated only when the external supply voltage Vcc is lower than the predetermined voltage, and controlled on the basis of the control voltage φ1 outputted by the control voltage generating circuit 1. On the other hand, the transistor P2 is operated at all times on the basis of a signal φH outputted by the data output control circuit 3, without depending upon the external supply voltage. In contrast with this, the transistor P4 connected in series with the transistor P3 controlled on the basis of the data signal φH is controlled on the basis of the control voltage φ1 which is dependent upon the external supply voltage as shown in FIG. 2. In more detail, when the external supply voltage Vcc is low below a predetermined voltage, the transistor P4 is turned on perfectly, so that the conductance of the output transistor can be increased.

In the vicinity of a point at which the low voltage is switched to the high voltage or vice versa, since the control voltage φ1 increases in analog manner and continuously, an abrupt change in the conductance near the switching point can be reduced, with the result that it is possible to improve the harmful influence of the output noise upon the circuit markedly. Further, when the external supply voltage Vcc rises, since the control voltage φ1 becomes roughly equal to the external supply voltage, the transistor P4 can be turned off perfectly, so that the conductance G of the output transistor can be reduced in the high voltage operation, thus allowing the output noise to be reduced.

Figure 21:
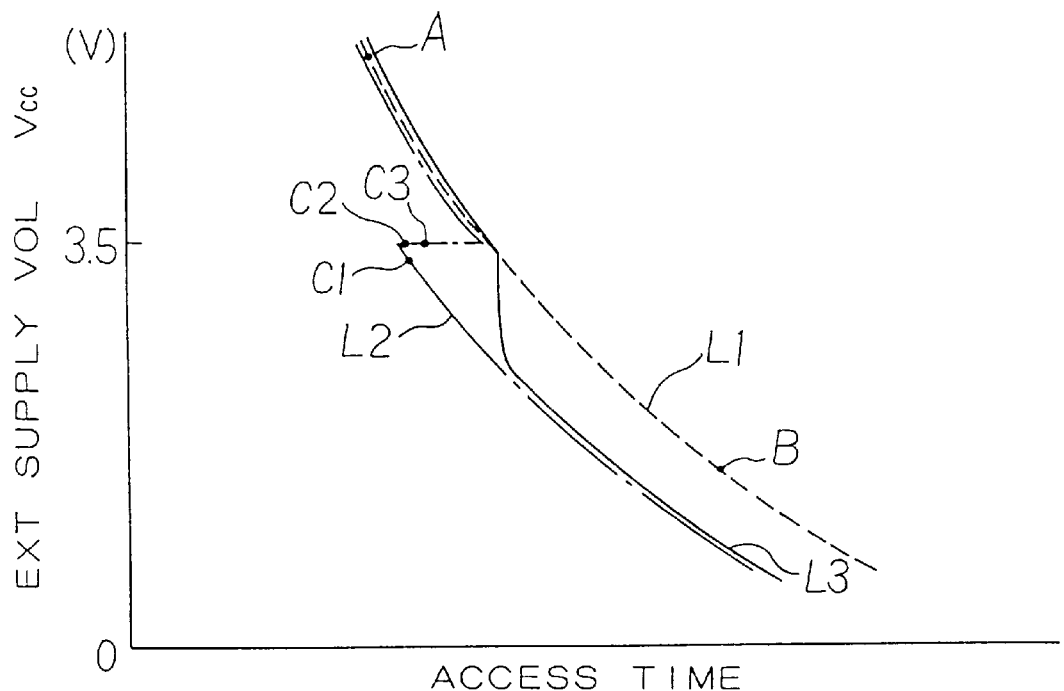
FIG. 21 is a graphical representation showing the relationship between the external supply voltage and the access time, in comparison between the first to third embodiments of the semiconductor integrated circuit device according to the present invention and the device related to the present invention.

As already explained with reference to FIG. 21, when the conductance of the data output transistor or the internal supply voltage driving transistor is changed digitally, the access time changes abruptly according to the external supply voltage Vcc, as shown by the dashed lines L2. In this case, since the points to be measured increase, the inspection process is complicated and thus the inspection time increases.

In the integrated circuit device according to the present invention, since the conductance of the data output transistor or the internal supply voltage driving transistor changes gradually or in analog manner, the access time changes also gently, as shown by the solid lines L3. As a result, it is possible to reduce the measurement point as compared with the prior art case of the dot-dashed lines L2, thus shortening the inspection time.

Figure 17:
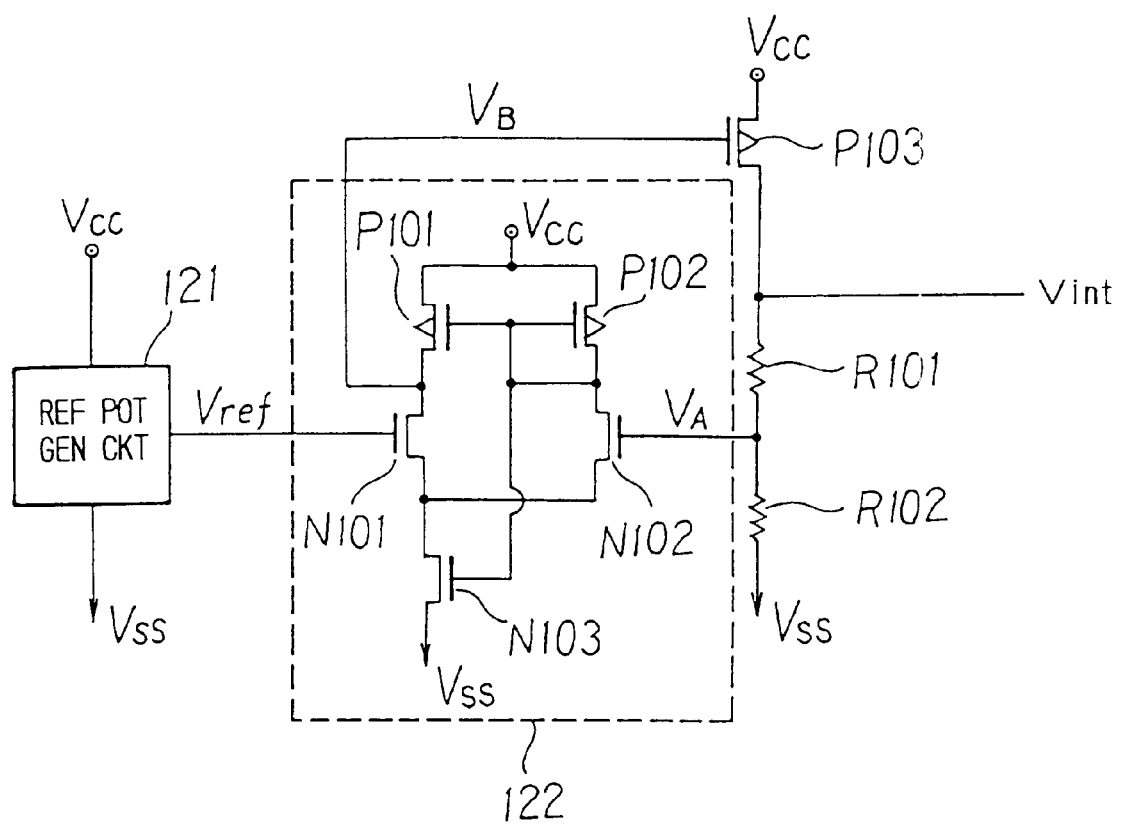
FIG. 17 is a circuit diagram showing the internal supply voltage deboosting circuit shown in FIG. 1(b)

FIG. 17 is a more detailed circuit diagram showing the internal supply voltage deboosting circuit 9 of the semiconductor integrated circuit device (shown in FIG. 1(b)) for generating the internal supply voltage Vint. As shown in FIG. 2, the internal supply voltage Vint is increased linearly in the low voltage range roughly in the same way as the external supply voltage Vcc, kept at a constant level from a predetermined value irrespective of the change in the external supply voltage Vcc, and increased again linearly in the high voltage range beyond the predetermined value in the same as the external supply voltage Vcc. In this embodiment, although the internal supply voltage Vint changes as shown, without being limited only thereto, the change of the internal supply voltage Vint can be modified. For instance, it is also possible to use the internal supply voltage whose change rate is uniform but smaller than that of the external supply voltage. In this case, it is possible to use a reference voltage generating circuit for generating a reference voltage, instead of the internal supply voltage deboosting circuit. Further, in this case, the reference voltage is inputted to the gate of the transistor P1, instead of the internal supply voltage.

The internal supply voltage deboosting circuit shown in FIG. 17 is composed of a reference voltage generating circuit 121, a P-channel transistor P103 for driving the internal voltage supply, a current mirror circuit type differential amplifier 122 for controlling the switching operation of the P-channel transistor P103 (which includes two P-channel transistors P101 and P102 and three N-channel transistors N101 to N103), and two resistors R101 and R102. The reference voltage generating circuit 121 generates a reference voltage Vref on the basis of the external supply voltage Vcc. Further, a difference between the internal supply voltage Vint (outputted by the P-channel transistor P103) and a set voltage Vss is divided by the resistors R101 and R102, and outputted as a potential VA.

This reference voltage Vref and the potential VA are both inputted to the gates of the N-channel transistors N101 and N102 of the differential amplifier 122, respectively. When the external supply voltage Vcc is low, the potential VA is lower than the differential reference potential Vref. In this case, the output voltage VB of the differential amplifier 122 is at a low level, so that the P-channel transistor P103 is turned on. Here, in the case where the dimensions are so determined that the resistance of the P-channel transistor P103 is determined sufficiently small relative to the resistances R101 and R102, it is possible to obtain the internal supply voltage Vint roughly equal to the external supply voltage Vcc. In contrast with this, when the external supply voltage Vcc is high, the potential Va becomes higher than the reference voltage Vref. In this case, the output voltage VB of the differential amplifier 122 is at a high level, so that the P-channel transistor P103 is turned off. Accordingly, the level of the internal supply voltage Vint decreases due to discharge through the resistors R101 and R102. Here, when the potential Va decreases below the reference voltage Vref, since the P-channel transistor P103 is turned on again, the internal supply voltage Vint is kept at a constant level. As a result, at a time when the potential VA becomes equal to the reference voltage Vref, the internal supply voltage Vint is kept constant.

As described above, when the external supply voltage Vcc is low, the reference voltage Vref is higher than the potential VA, so that it is possible to obtain the internal supply voltage Vint roughly equal to the external supply voltage Vcc. On the other hand, when the external supply voltage Vcc is high, at a time point when the reference voltage Vref becomes equal to the potential VA, the internal supply voltage Vint is kept constant.

Figure 18:
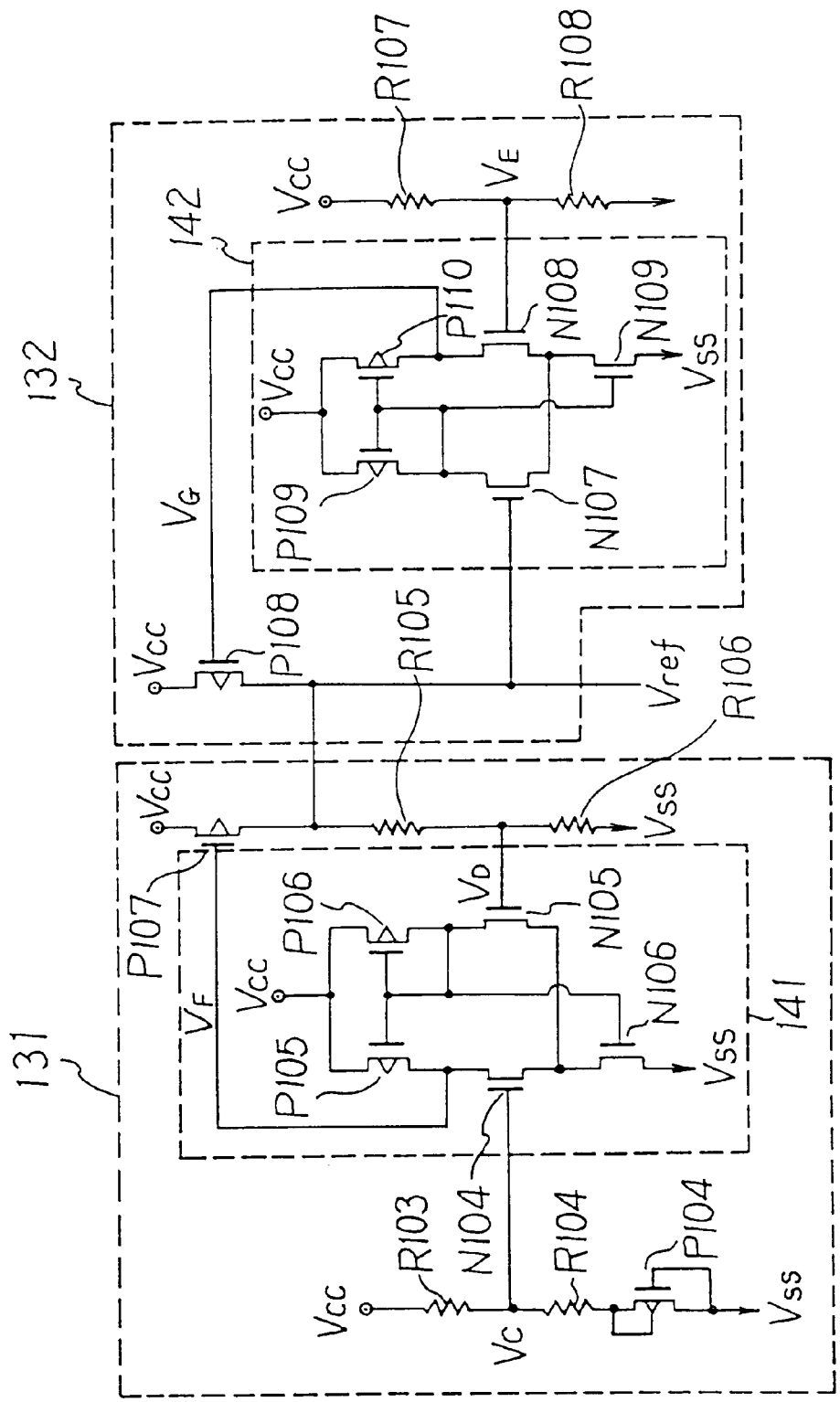
FIG. 18 is a circuit diagram showing the reference voltage generating circuit shown in FIG. 17.
Figure 19:
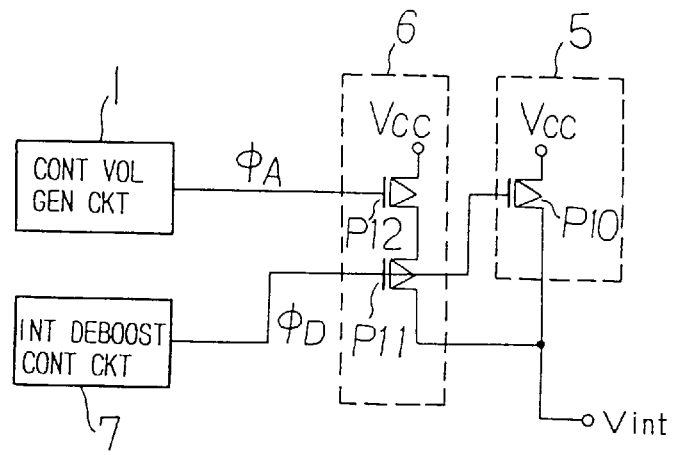
FIG. 19 is a circuit diagram showing the semiconductor integrated circuit device related to the present invention.
Figure 20:
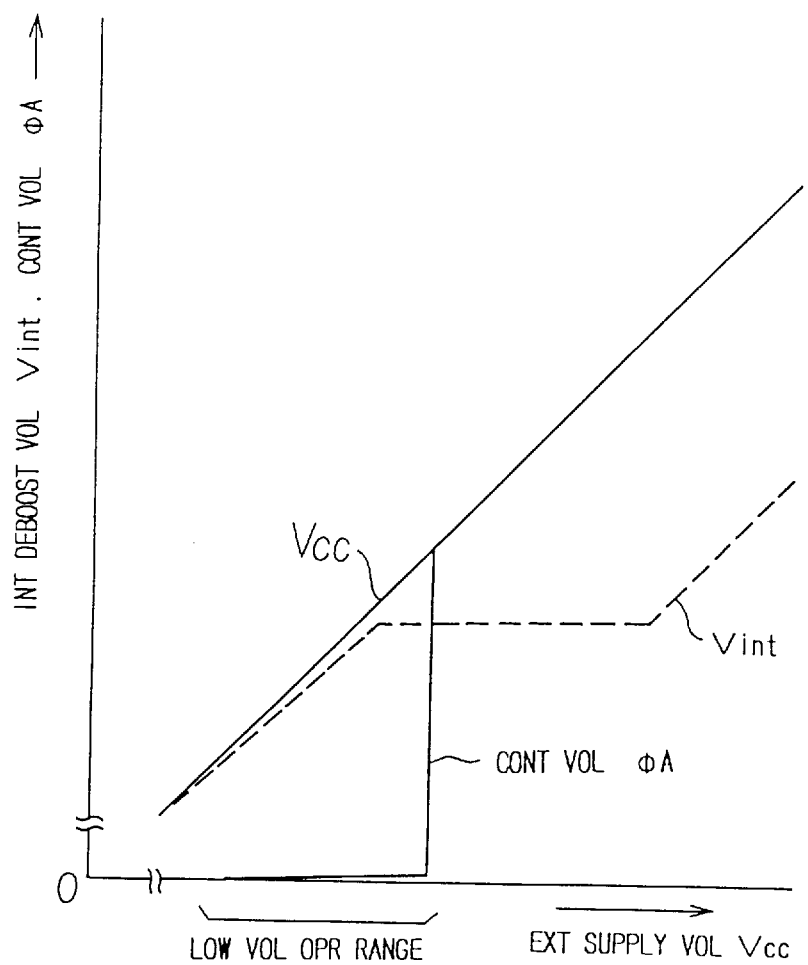
FIG. 20 is a characteristic diagram showing the dependency of the control voltage generated by the control voltage generating circuit upon the external supply voltage in the prior art device shown in FIG. 19.

FIG. 18 shows a practical circuit construction of the reference voltage generating circuit 121 used for the internal supply voltage deboosting circuit. The reference voltage generating circuit 121 is composed of two circuits 131 and 132. The circuit 131 decides the characteristics of the reference voltage Vref in the external supply voltage (Vcc) range between 0 and Vcur. Here, the voltage Vcur corresponds to the external supply voltage obtained when the reference voltage Vref is equal to voltage VE of the circuit 132 (described later). The internal supply voltage Vint increases beginning from this voltage Vcur, as shown in FIG. 2. Further, the circuit 132 decides the characteristics of the reference voltage Vref when the supply voltage Vcc is higher than the voltage Vcur. In the circuit 131, between the external supply voltage (Vcc) terminal and the ground voltage (Vss) terminal, resistors R103 and R104 and a P-channel transistor P104 are connected in series, and a voltage VC can be obtained from a junction node between the two resistors R103 and R104. Here, the resistance of the resistor R103 is determined to be sufficiently higher than that of the resistor R104. Therefore, the voltage VC can be kept at a constant level, irrespective of the external supply voltage Vcc. This voltage VC is inputted to a differential amplifier 141 composed of P-channel transistors P105 and P106 and N-channel transistors N104 to N106.

Further, between the external supply voltage (Vcc) terminal and the ground voltage (Vss) terminal, a P-channel transistor P107 and resistors R105 and R106 are connected in series. A voltage VD is outputted from a junction node between the resistors R105 and R106. The voltage VD and the voltage VC are both inputted to the differential amplifier 141. In the circuit 131, when the external supply voltage Vcc is high in the same way as in FIG. 17, the reference voltage Vref outputted from a junction node between the P-channel transistor P107 and the resistor R105 is kept at a constant level. In the circuit shown in FIG. 17, the resistance of the P-channel transistor P103 is determined to be sufficiently smaller than those of the resistances R101 and R102. On the contrary, in this circuit 131, the resistance of the P-channel transistor P107 is determined to be larger than those of the resistors R105 and R106. This is because the circuit is so designed that the voltage VD can be determined by division of the P-channel transistor P107 and the resistance R105 by the resistance R106. The circuit 132 is composed of two resistors R107 and P108, a differential amplifier 142, and a P-channel transistor P108 as a driving transistor. The differential amplifier 142 compares a potential VE obtained by dividing the external supply voltage Vcc by the two resistors R107 and R108 with the reference voltage Vref. When the external supply voltage Vcc lies in a range between 0 to Vcur, the reference voltage Vref is higher than the potential VE.

In this case, the output voltage of the differential amplifier 142 is at the high level, so that the P-channel transistor P108 is turned off. Therefore, the reference voltage Vref can be decided by only the circuit 131. When the external supply voltage Vref becomes higher than the voltage Vcur, the reference voltage Vref becomes lower than the potential VE. Therefore, the output voltage VG of the differential amplifier 142 becomes the low level, so that the P-channel transistor P108 is turned on. When the P-channel transistor P108 is turned on, the voltage VF of the differential amplifier 141 of the circuit 131 becomes the high level, so that the P-channel transistor P107 is turned off. As a result, the reference voltage Vref can be determined by the circuit 132. When the external supply voltage Vcc further increases, the reference voltage Vref also increases. Further, the internal supply voltage Vint increases in the range in which the external supply voltage Vcc is higher than the voltage Vcur. The reason is as follows: in the case of products using the external supply voltage Vcc of 5 V, although the voltage range to be used is between 4.5 V and 5.5 V, the burn-in test is effected at a voltage higher than this voltage range.

With reference to FIGS. 3(a) and (b), the second embodiment will be described hereinbelow. FIG. 3(a) shows the semiconductor integrated circuit device including an output circuit provided with both a high-level output and a low-level output; and FIG. 3(b) shows a control voltage generating circuit for generating a control voltage φ2 used for this output circuit. This output circuit uses both the control voltage generating circuit as shown in FIG. 1(b) and the control voltage generating circuit 2 as shown in FIG. 3(b). The control voltage generating circuit 2 is composed of a resistor R2 connected to an external supply voltage (Vcc) terminal, and an N-channel transistor N4 connected in series with the resistor R2. The control voltage φ1 outputted by the control voltage generating circuit 1 is inputted to the gate of the transistor N4. Further, the control voltage φ2 is taken out of an intermediate tap between the transistor N4 and the resistor R2. As described already in the first embodiment, since the control voltage φ1 outputted by the control voltage generating circuit 1 increases continuously in analog manner with increasing external supply voltage Vcc, the control voltage φ2 changes in phase opposite to that of the control voltage φ1. This output circuit is composed of a P-channel transistor P2, a P-channel transistor P3 and a P-channel transistor P4 (in the same way as in FIG. 1), and in addition an N-channel transistor N1 connected in series with the transistor P2, an N-channel transistor N3 connected in parallel to the transistor N1 and in series with the transistor P2, and an N-channel transistor N2 connected in series with the transistor N3.

The drains of the transistors P2, P3, N1 and N3 are all connected to an input/output terminal (I/O pad) 4. The transistor P2 constitutes a full-voltage operating output section 5 for outputting a high-level ("1") signal, and the transistors P3 and P4 constitutes a low-voltage operating output section 6 for outputting a high-level ("1") signal. Further, the transistor N1 constitutes a full-voltage operating output section 51 for outputting a low-level ("0") signal, and the transistors N2 and N3 constitutes a low-voltage operating output section 61 for outputting a low-level ("0") signal. The high-level outputting transistor P2 and the low-level outputting transistor N1 both always operate on the basis of the high-level data signal φH and the low-level data signal φL of the data output control circuit 3, without depending upon the external supply voltage. On the other hand, in order to control the transistor P4 connected in series with the transistor P3 controlled on the basis of the data signal φH, when the control signal φ1 dependent upon the external supply voltage Vcc as shown in FIG. 2 is used, since the transistor P4 is turned on perfectly when the external supply voltage is low below a predetermined voltage, it is possible to increase the conductance of the output transistor. Therefore, in the vicinity of the switching point between the low voltage and the high voltage, since the control voltage φ1 changes continuously in analog manner, it is possible to reduce an abrupt change of the conductance thereat. As a result, it is possible to eliminate the harmful influence of output noise markedly.

Further, when the external supply voltage rises, since the level of the control voltage φ1 becomes roughly equal to the external supply voltage Vcc, the transistor P4 can be turned off perfectly, with the result that the conductance of the output transistor can be lowered at the high voltage, thus reducing the output noise. Further, the same as above can be applied to the case of the low-level output. In this case, the transistor N2 connected in series with the transistor N3 controlled on the basis of the data signal φL is controlled by the control voltage φ2 shown in FIG. 3(b), whose phase is opposite to the control signal φ1 shown in FIG. 1(b).

Figure 5:
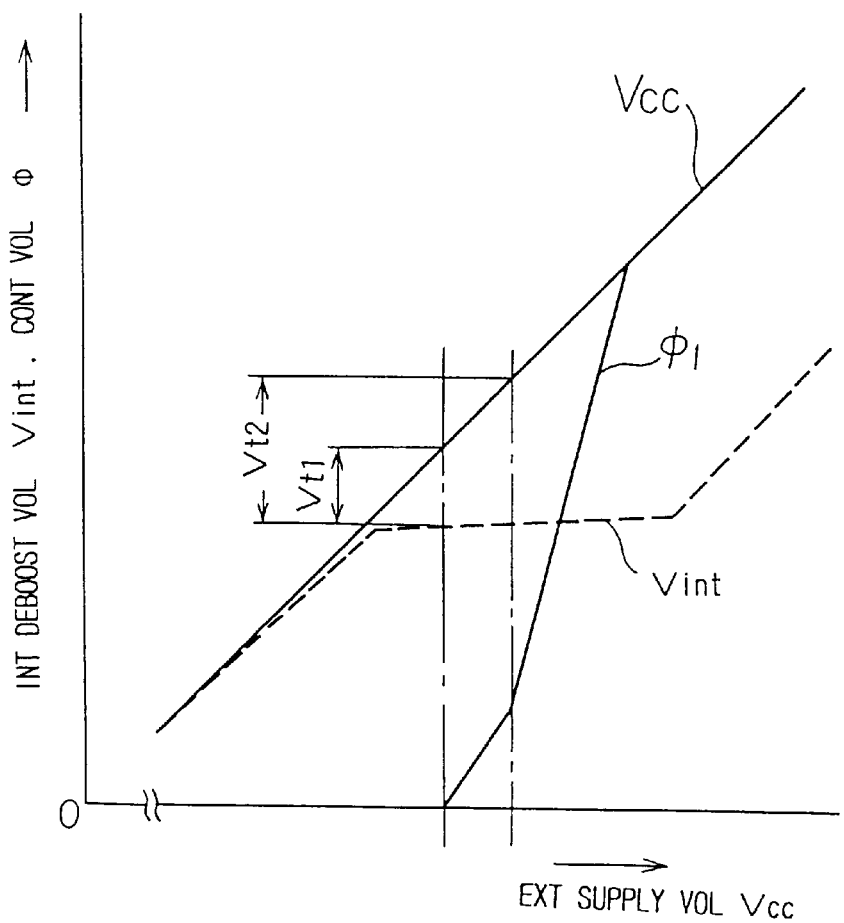
FIG. 5 is a characteristic diagram for showing the dependency of the control voltage generated by the control voltage generating circuit upon the external supply voltage in the semiconductor integrated circuit device shown in FIG. 4.

With reference to FIGS. 4 and 5, a third embodiment will be described hereinbelow. FIG. 4 shows a control voltage generating circuit used for this embodiment, and FIG. 5 shows the characteristics in which the dependency of the control voltage generated by the control voltage generating circuit upon the external supply voltage is shown. The control voltage generating circuit is composed of a P-channel transistor P8 having a source connected to an external supply voltage (Vcc) terminal and a gate connected to an internal supply voltage (Vint) terminal, and a P-channel transistor P1 having a source connected to an external supply voltage (Vcc) terminal and a gate connected to an internal supply voltage (Vint) terminal, and a resistor R1 having one end connected in series with the drain of the transistors P1 and P8 and the other end connected to a ground voltage (Vss) terminal. The control voltage φ1 is taken out of an intermediate tap between the transistors P1 and P8 and the resistor R1. As already explained, in the range where the gate-source voltage Vgs (Vcc−Vint) of the transistor is lower than the threshold voltage of the transistor, since the transistor is turned off, the control voltage φ1 is at a low level. When the voltage Vgs (Vcc−Vint) becomes higher than the threshold voltage, the transistor begins to be turned on. In this turn-on start region, since the conductance of the transistor is small, the control voltage φ1 can be determined on the basis of the voltage division ratio of the transistor and the resistor.

Accordingly, since the conductance of the transistor increases with increasing gate voltage of the transistor, the control voltage φ1 rises in analog manner with increasing external supply voltage Vcc. When the external supply voltage Vcc further rises, since the gate voltage of the transistor becomes sufficiently high, the resistance of the transistor is can be negligible in comparison with the resistance R1. Here, since the voltage drop of the transistor becomes roughly zero, the control voltage φ1 becomes roughly equal to the external supply voltage Vcc. In this embodiment, the two transistors P1 and P8 whose threshold voltages VT1 and |VT2| are different from each other are used. For instance, if |VT1| (the threshold voltage of the transistor P1) is lower than |VT2| (the threshold voltage of the transistor P8), since the two transistors are both turned off in the range where the gate-source voltage (Vcc−Vint) of the transistor is lower than the threshold voltages |VT1| and |VT2| of the transistors P1 and P8, the control voltage φ1 is at the low level. However, in the range where the gate-source voltage (Vcc−Vint) of the transistor is higher than the threshold voltage |VT1| of the transistor P1 but lower than the threshold voltage |VT2| of the transistor P8, since only the transistor P1 begins to be turned on, the control voltage φ1 rises gradually as shown in FIG. 5.

Further, when the gate-source voltage (Vcc−Vint) increases beyond both the threshold voltages, since the transistor P8 is additionally turned on, when the external supply voltage Vcc increases sufficiently high, the gate voltages of both the transistors P1 and P8 rise sufficiently high. Therefore, the division voltage of the transistor becomes roughly zero, so that the control voltage φ1 is roughly equal to the external supply voltage Vcc. Consequently, the rise tendency of the control voltage φ1 becomes more sharp in comparison with the former range. In this embodiment, although the two transistors are used, it is also possible to use three or more transistors. When the number of the transistors increases, it is possible to modify the rise rate of the control voltage φ1 more finely in such a way that the control voltage rises gradually at the start but sharply in the vicinity of the external supply voltage Vcc in accordance with a curved line. That is, when a plurality of transistors are used, since the conductances of the transistors change without producing discontinuous points, it is possible to turn off the transistors perfectly in the high voltage operation range. The control voltage can be used for the internal supply voltage driving transistor and the data outputting transistor.

Figure 6:
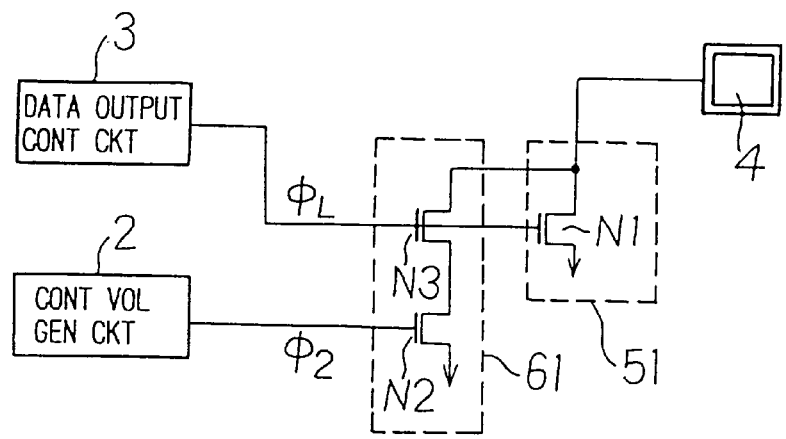
FIG. 6 is a circuit diagram showing a fourth embodiment of the semiconductor integrated circuit device according to the present invention.

With reference to FIG. 6, a fourth embodiment will be described hereinbelow. FIG. 6 shows a semiconductor integrated circuit device provided with a low-level output circuit. In this output circuit, the control voltage φ2 is generated by the control voltage generating circuit as shown in FIG. 3(b), and the control voltage φ1 is generated by the control voltage generating circuit as shown in FIG. 1(b) (having the characteristics as shown in FIGS. 2 or 5). The output circuit is composed of an N-channel transistor N1, an N-channel transistor N3 connected in parallel to the transistor N1, and an N-channel transistor N2 connected in series with the transistor N3. The drains of the two transistors N1 and N3 are connected to an input/output terminal 4. Further, the transistor N1 constitutes the full-voltage operating output section 51 for outputting the low-level output signal, and the transistors N2 and N3 constitute the low-voltage operating output section 61 for outputting the low-level output signal. The low-level outputting transistor N1 always operates on the basis of the low-level data signal φL, without depending upon the external supply voltage. On the other hand, the transistor N2 connected in series with the transistor N3 controlled on the basis of the data signal φL is controlled on the basis of the control signal φ2 opposite in phase to the control voltage φ1. In the vicinity of the switching point where the external supply voltage is switched between the low voltage and the high voltage, since the control voltage φ2 changes continuously in analog manner, it is possible to reduce an abrupt change of the conductance thereat. As a result, it is possible to eliminate the harmful influence of output noise markedly. Further, when the external supply voltage rises, since the transistor N2 can be turned off perfectly, the low-voltage operating output section of the output circuit will not operate.

A fifth embodiment of the present invention will be described hereinbelow. In the first embodiment, as shown in FIG. 1, the output circuit is provided with the full-voltage operating output section 5 having the P-channel transistor P2 and the low-voltage operating output section 6 having the P-channel transistors P3 and P4. Since the dimensions of these transistors are relatively large, the element area occupied by these three transistors is also relatively large.

Figure 7:
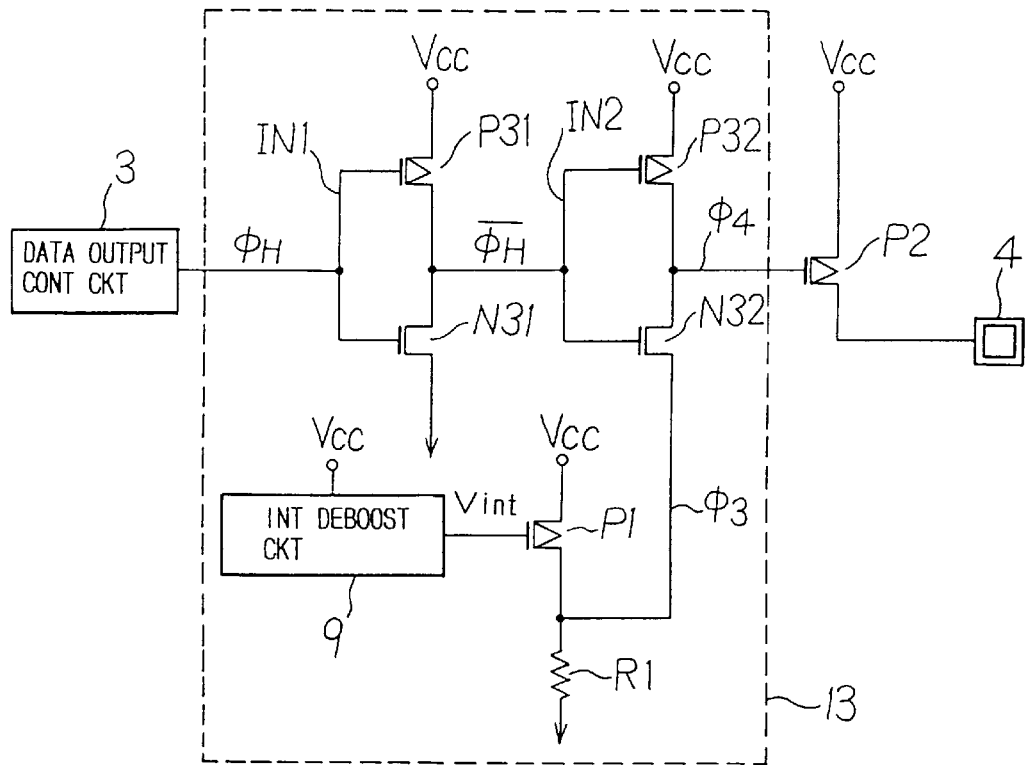
FIG. 7 is a circuit diagram showing a fifth embodiment of the semiconductor integrated circuit device according to the present invention.

In this fifth embodiment, as shown in FIG. 7, the output circuit is provided with a single P-channel transistor P2. A control signal φ4 inputted to the gate of the P-channel transistor P2 must have such characteristics that the data signal φH (outputted by the data output control circuit 3) and the control signal Vint (for controlling the conductance of the P-channel transistor P2 so as to be increased at the low voltage) are combined with each other. The control signal φ4 as described above can be generated by a control circuit 13 as shown in FIG. 7.

This control circuit 13 is composed of an inverter IN1 having a P-channel transistor P31 and an N-channel transistor N31 both responsive to the data signal φH outputted by the data output control circuit 3, an inverter IN2 having a P-channel transistor P32 and an N-channel transistor N32 both connected between an output terminal of the inverter IN1 and the gate of the P-channel transistor P2, and an internal supply voltage deboosting circuit 9 for inputting a control signal φ3 to the source of the N-channel transistor N32 in cooperation with a P-channel transistor P1 and a resistance R1. Here, the internal supply voltage deboosting circuit 9 for generating the control signal Vint and the circuit composed of the P-channel transistor P1 and the resistance R1 are the same as the internal supply voltage deboosting circuit shown in FIG. 1(b).

Figure 11:
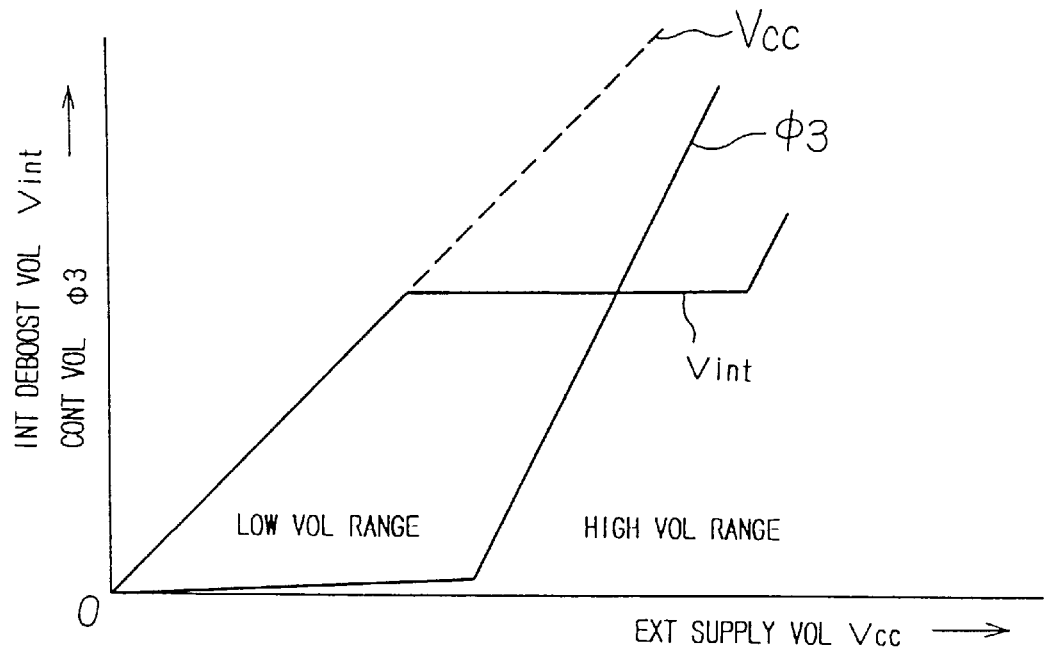
FIG. 11 is a characteristic diagram showing the dependency of the generated control voltage upon the external supply voltage in the fifth to eighth embodiments of the semiconductor integrated circuit device according to the present invention.

FIG. 11 shows the change of the internal supply voltage Vint and the control signal φ3 according to the external supply voltage Vcc. As already explained with reference in FIG. 2, the internal supply voltage Vint changes roughly in the same way as the external supply voltage Vcc in the low voltage range. However, the internal supply voltage Vint is kept constant beyond a predetermined value, and further changes roughly in the same way as the external supply voltage Vcc in the high voltage range (in which the external supply voltage Vcc exceeds a predetermined value). Further, the control signal φ3 outputted from the node between the P-channel transistor P1 (having the gate to which the internal supply voltage Vint is inputted) and the resistance R1 is roughly zero volts in the low voltage range, but is provided with such characteristics as to increase linearly with increasing external supply voltage Vcc in the high voltage range. When the control signal φ3 as described above is inputted to the source of the N-channel transistor N32 of the inverter IN2, the inverter IN2 operates in the same way as with the case of the ordinary inverter, so that the data signal φ4 roughly the same as the data signal φH outputted by the data output control circuit 3 is applied to the gate of the P-channel transistor P2. In the high voltage range, however, since the source potential of the N-channel transistor N32 of the inverter IN2 rises gradually, the voltage of the data signal φ4 outputted by the inverter IN2 increases slightly higher than that of the data signal φH originally outputted by the data output control circuit 3. Therefore, the driving capability of the P-channel transistor P2 (having the gate to which the data signal φ4 is inputted) is high when the external supply voltage Vcc is low but drops gradually when Vcc increases. As a result, it is possible to construct the output circuit by use of only one P-channel transistor P2, thus enabling the element area to be reduced.

Figure 8:
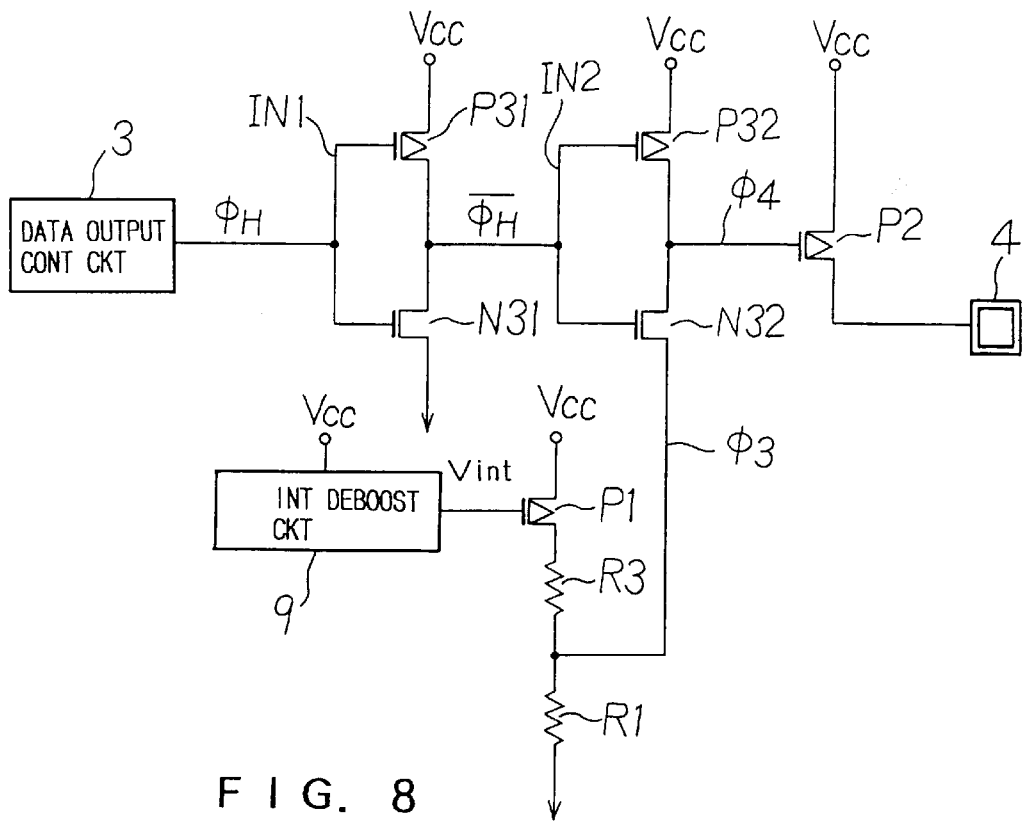
FIG. 8 is a circuit diagram showing a sixth embodiment of the semiconductor integrated circuit device according to the present invention.

Here, in FIG. 11, when the control signal φ3 increases with increasing external supply voltage Vcc to such an extent that the level of the control signal φ3 matches that of the external supply voltage Vcc, the inverter IN2 no longer operate as an inverter. As a result, no data signal φ4 is inputted to the P-channel transistor P2. To avert this phenomenon, it is necessary to keep the level of the control signal φ3 lower than that of the external supply voltage Vcc. FIG. 8 shows a sixth embodiment. In this embodiment, a resistance R3 is added between the source of the P-channel transistor P1 and the resistance R1, and the control signal φ3 is taken out of a junction node between the two resistances R1 and R3. The addition of the resistance R3 allows the control signal φ3 to be kept lower than the external supply voltage Vcc, so that the operation of the inverter IN2 can be secured in order to enable the data signal φ4 to be inputted to the transistor P2 even in the high voltage range.

FIG. 9 shows a seventh embodiment. This embodiment is different from the sixth embodiment in that another P-channel transistor P33 is used instead of the resistance R3. This P-channel transistor P3 is used as only a resistance element, and the control signal Vint is inputted to the gate of this transistor P3, in the same way as with the case of the transistor P1.

FIG. 10 shows an eighth embodiment, in which a circuit composed of P-channel transistors P34 and P35, an inverter IN3, and N-channel transistors N33 and N34 is used instead of the inverters IN1 and IN2 used in the fifth to seventh embodiments. The data signal φH outputted by the data output control circuit 3 is inputted to the gate of the P-channel transistor P34 and further inverted through the inverter IN3. The inverted data signal /φH is inputted to the gate of the P-channel transistor P35. A control signal φ3 generated between a junction node between the resistances R3 and R4 is inputted to the sources of the N-channel transistors N33 and N34. A control signal φ4 is outputted from a junction node among the drains of the P-channel transistor P35 and the N-channel transistor N34, and the gate of the N-channel transistor N33, and then inputted to the gate of the P-channel transistor P2. Therefore, in the same way as in the fifth to seventh embodiment, it is possible to output data by increasing the driving capability of the P-channel transistor P2 at the low voltage, as compared with at the high voltage.

Figure 12:
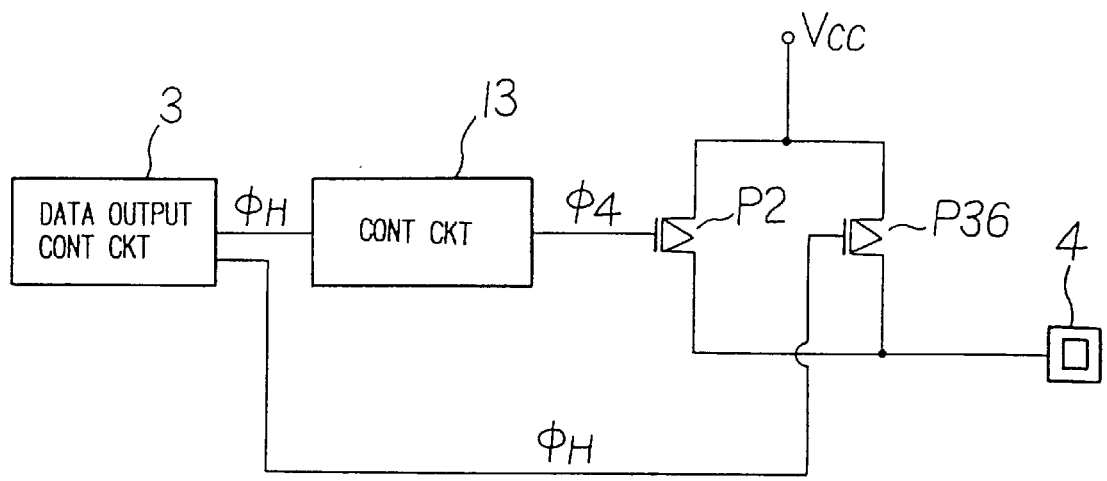
FIG. 12 is a circuit diagram showing a ninth embodiment of the semiconductor integrated circuit device according to the present invention.

In the above-mentioned fifth to eighth embodiments, a single P-channel transistor P2 is used as the output circuit. In contrast with these embodiments, in a ninth embodiment shown in FIG. 12, two P-channel transistors P2 and P36 are used. These two transistors P2 and P36 are connected in parallel to each other between the external supply voltage (Vcc) terminal and the input/output terminal 4. The data signal φH outputted by the data output control circuit 3 is inputted to the control circuit 13 as already explained with reference to FIG. 7, and the generated control signal φH is inputted to the gate of the P-channel transistor P2. Therefore, the P-channel transistor P2 outputs the data signal from the source thereof under the condition that the driving capability of the P-channel transistor P2 is controlled high when the external supply voltage Vcc is low, in comparison with when high. Further, the data signal φH outputted by the data output control circuit 3 is also inputted to the gate of the P-channel transistor P36. Therefore, the input/output terminal 4 is charged by two currents outputted from the sources of the two P-channel transistors P2 and P36, so that the data signal can be outputted.

Figure 13:
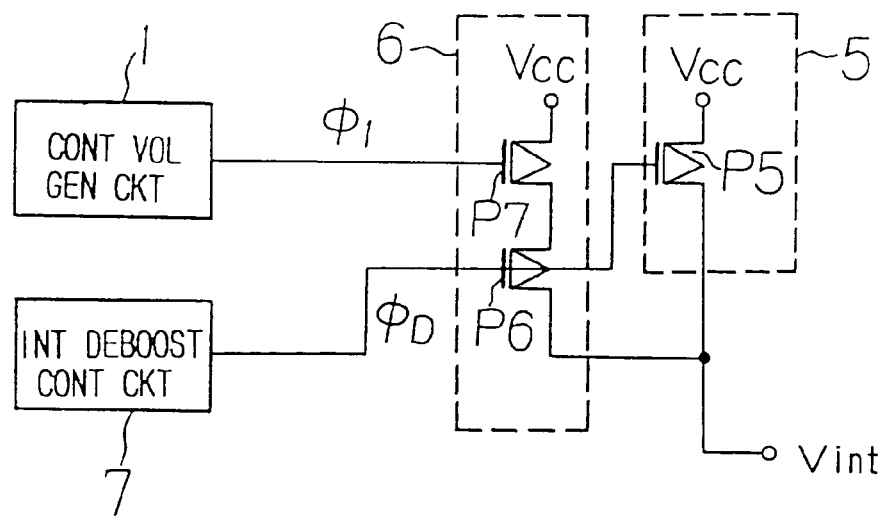
FIG. 13 is a circuit diagram showing a tenth embodiment of the semiconductor integrated circuit device according to the present invention.

With reference to FIG. 13, a tenth embodiment is described. FIG. 13 shows an internal supply voltage deboosting circuit which uses the control voltage φ1 provided with the characteristics as shown in FIGS. 2 or 5. The circuit includes an internal deboosted supply voltage driving transistors connected to the external supply voltage Vcc and an internal deboost control circuit. This circuit is composed of a P-channel transistor P7 having a source connected to the external supply voltage Vcc and a gate connected to the control voltage generating circuit 1, a P-channel transistor P6 having a source connected to the drain of the transistor P7 and a gate connected to an internal deboost control circuit 7, and a P-channel transistor P5 having a source connected to the external supply voltage Vcc and a gate connected to the external deboost control circuit 7. The internal supply voltage Vint is outputted from the drain of the transistors P5 and P6. The transistor P5 operates without depending upon the external supply voltage. The transistor P7 operates only when the external supply voltage is lower than a predetermined voltage, and controlled on the basis of the gate signal φ1 outputted by the control voltage generating circuit 1. Further, this circuit is provided with a high voltage operating range 5 including the transistor P5 and a low voltage operating range 6 including the transistors P6 and P7. The internal supply voltage driving transistor P5 is controlled on the basis of only the control signal φD of the internal deboost control circuit 7.

By inputting the control voltage φ1 to the gate of the transistor P7 controlled by the control signal φD, it is possible to realize the operation of sufficient margin, while preventing an abrupt change in the internal deboosted supply voltage due to abrupt change in the conductance of the internal deboosted supply voltage driving transistor at the switching point between the low and high voltages without producing any switching noise, in the same way as with the case of the first embodiment. Further, this internal supply voltage deboosting circuit can be applied to the output circuit which uses N-channel transistors, as shown in FIG. 6.

Figure 14:
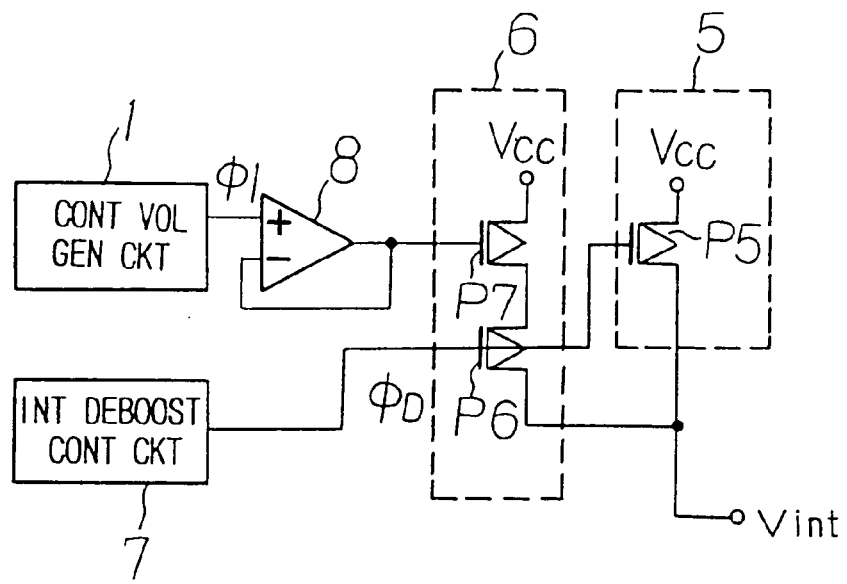
FIG. 14 is a circuit diagram showing an eleventh embodiment of the semiconductor integrated circuit device according to the present invention.

With reference to FIG. 14, an eleventh embodiment is described. FIG. 14 shows an internal supply voltage deboosting circuit which uses the control voltage φ1 provided with the characteristics as shown in FIGS. 2 or 5. The circuit includes an internal deboosted supply voltage driving transistors connected to the external supply voltage Vcc and an internal deboost control circuit. This circuit is composed of a P-channel transistor P7 having a source connected to the external supply voltage Vcc and a gate connected to the control voltage generating circuit 1, a P-channel transistor P6 having a source connected to the drain of the transistor P7 and a gate connected to an internal deboost control circuit 7, and a P-channel transistor P5 having a source connected to the external supply voltage Vcc and a gate connected to the internal deboost control circuit 7. The internal supply voltage Vint is outputted from the drain of the transistors P5 and P6. The above-mentioned construction is the same as that shown in FIG. 6. In this embodiment, however, a differential amplifier 8 is connected between the control voltage generating circuit 1 and the gate of the transistor P7. The output terminal of this differential amplifier 8 is connected to the inversion input terminal thereof. The output terminal of the control voltage generating circuit 1 is connected to an non-inversion-input terminal of this amplifier 8, and the gate of the transistor P7 is connected to the output terminal of this amplifier 8. By use of this amplifier 8, it is possible to improve the driving capability of the transistor. The transistor P5 operates without depending upon the external supply voltage. The transistor P7 operates only when the external supply voltage is lower than a predetermined voltage, and controlled on the basis of the control voltage φ1 outputted by the control voltage generating circuit 1. The internal supply voltage driving transistor P5 is controlled on the basis of only the control signal φD outputted by the internal deboost control circuit 7.

Figure 15:
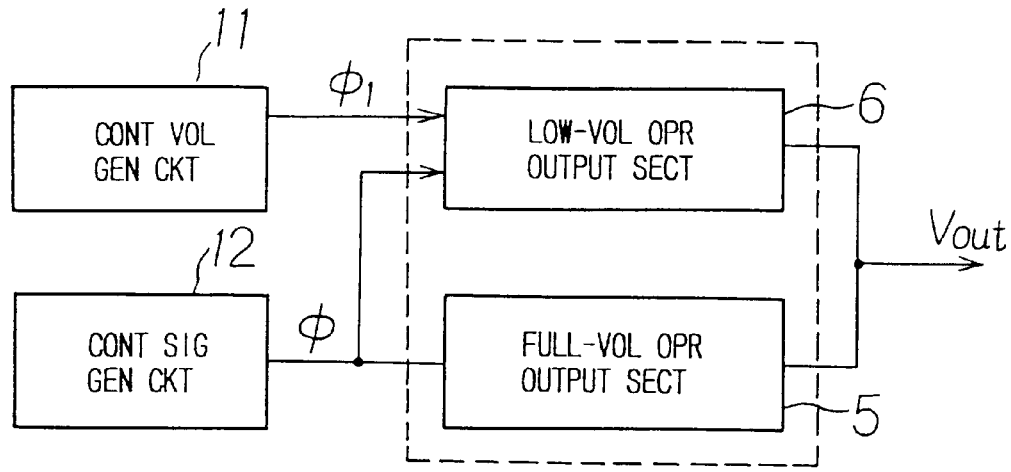
FIG. 15 is a circuit diagram showing a twelfth embodiment of the semiconductor integrated circuit device according to the present invention.

With reference to FIG. 15, a twelfth embodiment will be described. FIG. 15 shows an transistor output section operative on the basis of a predetermined supply voltage. A full-voltage operating output section 5 and a low-voltage operating output section 6 of the output section are both formed on the semiconductor substrate. Further, on the same semiconductor substrate, the control voltage generating circuit 11 for generating the control voltage φ1 and the control signal generating circuit 12 for generating the control signal φ are also formed. In this semiconductor integrated circuit device, when the external supply voltage Vcc is higher than a predetermined voltage, the full-voltage operating output section 5 operates under control of the output signal φ outputted by the control signal generating circuit 12, and outputs the output voltage Vout. When the external supply voltage Vcc is lower than the predetermined voltage, the low-voltage operating output section 6 operates under control of the output signal φ, and outputs the output voltage Vout. Here, however, the operating transistor (not shown) included in the output section 6 is controlled by the control signal φ1 of the control voltage generating circuit 11. When the operating transistor is an internal supply voltage driving transistor, the internal supply voltage Vint is outputted as the output voltage Vout, and when the operating transistor is the data output transistor, the output voltage is outputted through the output terminal (not shown) formed on the semiconductor substrate. The control voltage φ1 inputted to the low-voltage operating output section 6 is provided with the dependency upon the external supply voltage as shown in FIGS. 2 or 5, and outputted from the control voltage generating circuit 11. This control voltage φ1 is applied to the gate of the operating transistor to control the same transistor. Since this control voltage φ1 is used, it is possible to prevent an abrupt change of the conductance of the operating transistor in the range in which the high supply voltage is switched to the low supply voltage or vice versa and further the switching noise, thus securing the operation with a sufficient margin.

Figure 16:
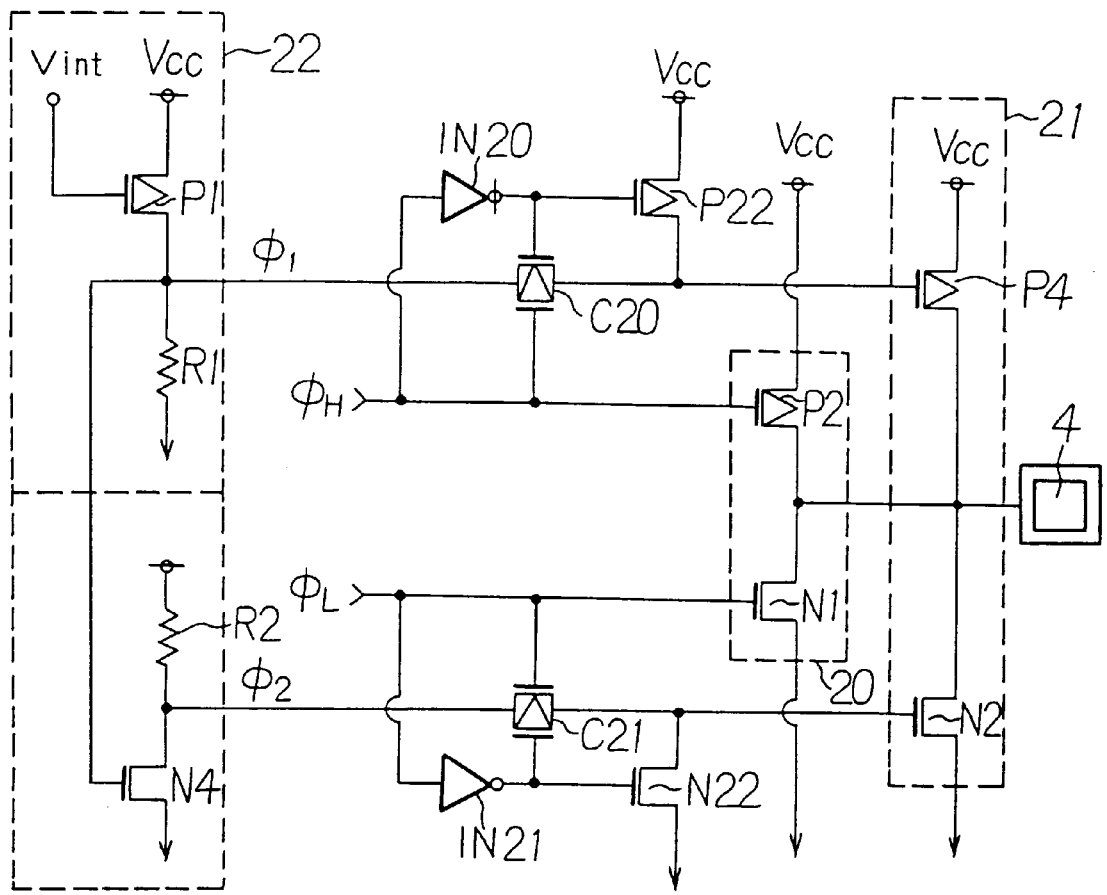
FIG. 16 is a circuit diagram showing a thirteenth embodiment of the semiconductor integrated circuit device according to the present invention.

With reference to FIG. 16, a thirteenth embodiment will be described hereinbelow. FIG. 16 shows the output circuit of the semiconductor integrated circuit device. The output circuit is composed of a low-voltage operating output section 21 operative only in a range at which the external supply voltage Vcc is lower than a predetermined voltage, a full-voltage operating output section 20 operative in all the voltage range of the external supply voltage Vcc, an input/output terminal 4 connected to the output side of the output section, and in addition a control voltage generating circuit 22 for generating control voltages φ1 and φ2 applied to the gates of the transistors P4 and N2 of the low-voltage operating output section 21. Output transistors P2 and N1 of the full-voltage operating output section 20 are controlled on the basis of control signals φH and φL outputted by an output control circuit (not shown) and inputted to the gates of these transistors. The control voltages φ1 and φ2 are applied to the gates of the transistors 4 and N2 via transfer gates C20 and C21, respectively. In the case of the high level output, the high-level output control signal (the gate signal φH) is applied to the gate of a P-channel transistors for constituting the transfer gate C20 and further to the gate of an N-channel transistor for constituting the same via an inverter IN20. Therefore, when the gate signal φH is at the low level, the transfer gate C20 is turned on (a transfer enable state), so that the control voltage φ1 is applied to the gate of the output transistor P4 of the low-voltage operating output section 21.

As a result, on the basis of the control voltage φ1 provided with the dependency upon the external supply voltage as shown in FIG. 2, it is possible to substantially change the conductance of the output transistor P4 in analog manner and continuously in the switching range between the low and high voltages of the external supply voltage Vcc. Further, when the high-level voltage is not outputted, the P-channel transistor P22 fixes the gate of the output transistor P4 at the high level to keep this transistor turned off.

In the case of the low level output, in the same way as with the case of the high level output, the low-level output control signal (the gate signal φL) is applied to the gate of an N-channel transistors for constituting the transfer gate C21 and further to the gate of a P-channel transistor for constituting the same via an inverter IN21. Therefore, in the low-level output, when the gate signal φL changes to the high-level, the transfer gate C21 is turned off, so that the control voltage φ2 is applied to the gate of the output transistor N2 of the low-voltage operating output section 21. As a result, the output transistor N2 is controlled on the basis of the control voltage φ2 opposite in phase to the control signal φ1. When the low-level voltage is not outputted, the N-channel transistor N22 fixes the gate voltage of the output transistor N2 at the low level, so that the output transistor N2 is kept turned off. Owing to the control as described above, it is possible to prevent the abrupt change of the transistor conductance in the switching range between the high and low voltages, thus securing the operating margin.

As described above, in the semiconductor integrated circuit device according to the present invention, the voltage substantially changing in analog manner in proportion to the external supply voltage and according to the difference between the predetermined-level reference voltage and the external supply voltage is applied to the gates of the internal supply voltage driving transistor and the outputting transistor. Therefore, it is possible to prevent an abrupt change in the internal deboosted supply voltage due to an abrupt change in conductance of these transistors at the switching point between the high and low voltages and further to prevent the generation of the switching noise, so that a reliable operation having a sufficient margin can be realized. Further, since the gate voltages applied to the internal supply voltage driving transistor and the output transistor change in analog manner, the access time changes gradually in analog manner according to the external supply voltage, with the result that the inspection points can be reduced and thereby the inspection time can be shortened for reduction of the inspection cost thereof.

What is claimed is:

1. A semiconductor integrated circuit device, comprising:
 a data output and conductance control circuit supplied with an external power supply voltage, for receiving a data signal and outputting a control signal;
 an output transistor having one end supplied with the external power supply voltage, another end outputting data, and a gate receiving the control signal, wherein the control signal is generated in response to the data signal and a conductance control signal, the control signal controlling a conductance of the output transistor so that the conductance of the output transistor decreases continuously for increasing values of the external power supply voltage exceeding a predetermined level, whereby the driving capability of the output transistor is controlled in an analog manner in response to the control signal;
 an external power supply terminal providing the external power supply voltage, wherein the data output and conductance control circuit has an inverter connected between the external power supply voltage terminal and a conductance control node, the inverter receiving the data signal and outputting the control signal, and
 a conductance control signal generating circuit supplied with the external power supply voltage, for generating and outputting the conductance control signal to the conductance control node so as to change the level of the control signal outputted from the data output and conductance control circuit in accordance with the external power supply voltage, wherein the control signal generating circuit comprises:
  a reference voltage generating circuit supplied with the external power supply voltage, for generating a reference voltage having a constant level;
  a P-channel transistor having a source for receiving the external power supply voltage, a gate for receiving the reference voltage, and a drain for outputting the conductance control signal; and
  a resistor connected between the drain of the P-channel transistor and a ground terminal.

2. A semiconductor integrated circuit device, comprising:
 a data output and conductance control circuit supplied with an external power supply voltage, for receiving a data signal and outputting a control signal;
 an output transistor having one end supplied with the external power supply voltage, another end outputting data, and a gate receiving the control signal, wherein the control signal is generated in response to the data signal and a conductance control signal, the control signal controlling a conductance of the output transistor so that the conductance of the output transistor decreases continuously for increasing values of the external power supply voltage exceeding a predetermined level, whereby the driving capability of the output transistor is controlled in an analog manner in response to the control signal;
 an external power supply terminal providing the external power supply voltage, wherein the data output and conductance control circuit has an inverter connected between the external power supply voltage terminal and a conductance control node, the inverter receiving the data signal and outputting the control signal, and
 a conductance control signal generating circuit supplied with the external power supply voltage, for generating and outputting the conductance control signal to the conductance control node so as to change the level of the control signal outputted from the data output and conductance control circuit in accordance with the external power supply voltage, wherein the control signal generating circuit comprises:
  a reference voltage generating circuit supplied with the external power supply voltage, for generating a reference voltage having a constant level;
  a P-channel transistor having a source for receiving the external power supply voltage and a gate for receiving the reference voltage;

a first resistor connected between the drain of the P-channel transistor and a node for outputting the conductance control signal; and a second resistor connected between the node and a ground terminal.

3. A semiconductor integrated circuit device, comprising:

a data output and conductance control circuit supplied with an external power supply voltage, for receiving a data signal and outputting a control signal;

an output transistor having one end supplied with the external power supply voltage, another end outputting data, and a gate receiving the control signal, wherein the control signal is generated in response to the data signal and a conductance control signal, the control signal controlling a conductance of the output transistor so that the conductance of the output transistor decreases continuously for increasing values of the external power supply voltage exceeding a predetermined level, whereby the driving capability of the output transistor is controlled in an analog manner in response to the control signal;

an external power supply terminal providing the external power supply voltage, wherein the data output and conductance control circuit has an inverter connected between the external power supply voltage terminal and a conductance control node, the inverter receiving the data signal and outputting the control signal, and a conductance control signal generating circuit supplied with the external power supply voltage, for generating and outputting the conductance control signal to the conductance control node so as to change the level of the control signal outputted from the data output and conductance control circuit in accordance with the external power supply voltage, wherein the control signal generating circuit comprises:

a reference voltage generating circuit supplied with the external power supply voltage, for generating a reference voltage having a constant level;

a first P-channel transistor having a source for receiving the external power supply voltage and a gate for receiving the reference voltage;

a second P-channel transistor having a source connected to a drain of the first P-channel transistor, a gate for receiving the reference voltage, and a drain for outputting the conductance control signal; and a resistor connected between the drain of the second P-channel transistor and a ground terminal.

* * * * *